United States Patent
Lin et al.

(10) Patent No.: US 11,177,887 B2
(45) Date of Patent: Nov. 16, 2021

(54) SUBSTRATE WITH STEPPED PROFILE FOR MOUNTING TRANSMITTER OPTICAL SUBASSEMBLIES AND AN OPTICAL TRANSMITTER OR TRANSCEIVER IMPLEMENTING SAME

(71) Applicant: Applied Optoelectronics, Inc., Sugar Land, TX (US)

(72) Inventors: Kai-Sheng Lin, Sugar Land, TX (US); Hang Xie, Missouri City, TX (US); Yi Wang, Katy, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 0 days.

(21) Appl. No.: 16/737,438

(22) Filed: Jan. 8, 2020

(65) Prior Publication Data
US 2021/0211199 A1 Jul. 8, 2021

(51) Int. Cl.
*H04B 10/00* (2013.01)
*H04B 10/40* (2013.01)
*H04B 10/80* (2013.01)
*H04B 10/50* (2013.01)
*H01L 23/52* (2006.01)

(52) U.S. Cl.
CPC ............ *H04B 10/40* (2013.01); *H01L 23/52* (2013.01); *H04B 10/503* (2013.01); *H04B 10/801* (2013.01)

(58) Field of Classification Search
CPC .... H04B 10/40; H04B 10/503; H04B 10/801; H01L 23/52

USPC .......................................................... 398/135
See application file for complete search history.

(56) References Cited

U.S. PATENT DOCUMENTS

| 6,160,647 A * | 12/2000 | Gilliland | H04B 10/504 |
| | | | 398/1 |
| 2003/0206703 A1 | 11/2003 | Chiu et al. | |
| 2004/0240803 A1 | 12/2004 | Rechberger et al. | |
| 2006/0043609 A1* | 3/2006 | Brennan | H01L 24/49 |
| | | | 257/784 |
| 2012/0267777 A1* | 10/2012 | Haba | H05K 3/303 |
| | | | 257/737 |
| 2014/0105612 A1* | 4/2014 | Wu | H04B 10/40 |
| | | | 398/139 |
| 2019/0278035 A1* | 9/2019 | Pezeshki | G02B 6/421 |

OTHER PUBLICATIONS

U.S. Office Action dated Dec. 24, 2020, received in U.S. Appl. No. 16/737,414, 9 pgs.

* cited by examiner

*Primary Examiner* — Mohammad R Sedighian
(74) *Attorney, Agent, or Firm* — Grossman Tucker Perreault & Pfleger, PLLC; Norman S. Kinsella

(57) ABSTRACT

The present disclosure is generally directed to a stepped profile for substrates that support "on board" optical subassembly arrangements. The stepped profile enables mounting TOSA modules to the substrate in a recessed orientation to reduce the overall distance between terminals of the substrate and associated components of the TOSA, e.g., RF terminals of the substrate and an LDD of the TOSA. In an embodiment, the stepped profile further simplifies mounting and optical alignment of TOSA modules by providing at least one mechanical stop to engage surfaces of the TOSA modules and limit travel by the same along one or more axis.

13 Claims, 7 Drawing Sheets

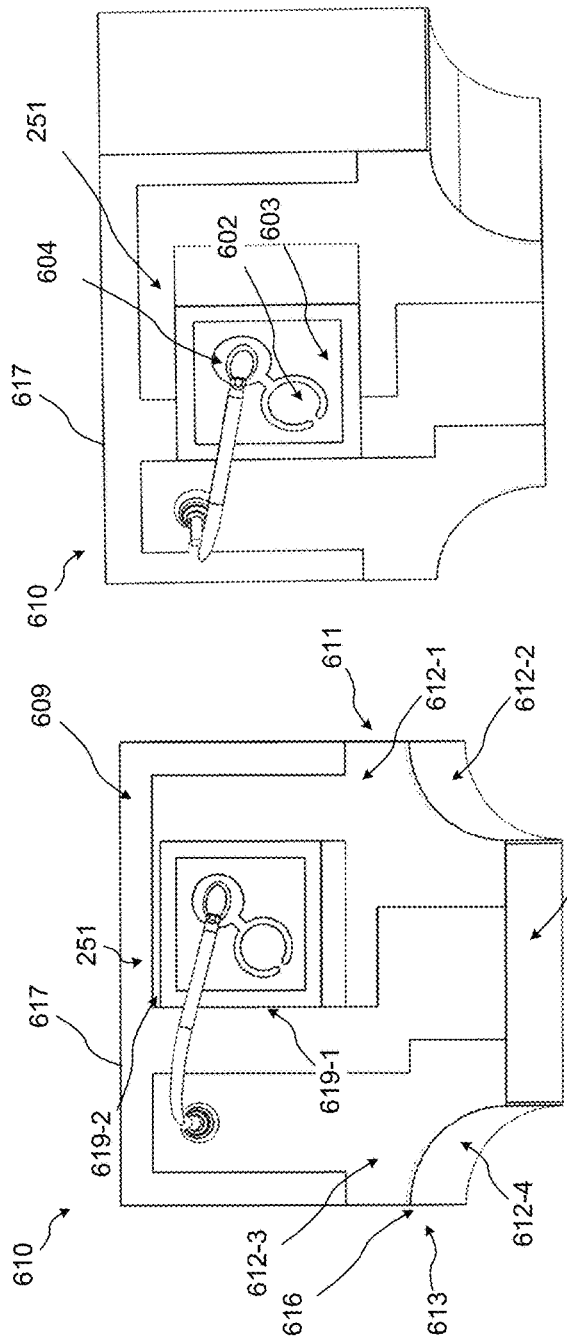
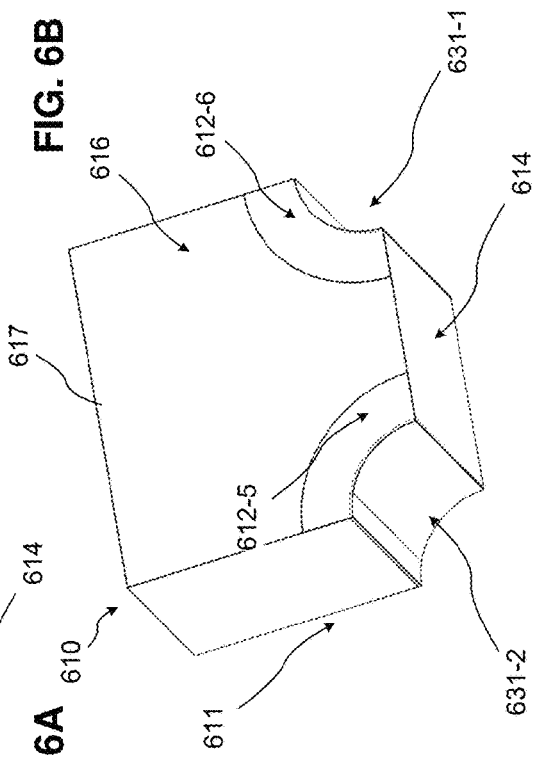
FIG. 6A  
FIG. 6B  
FIG. 6C

SUBSTRATE WITH STEPPED PROFILE FOR MOUNTING TRANSMITTER OPTICAL SUBASSEMBLIES AND AN OPTICAL TRANSMITTER OR TRANSCEIVER IMPLEMENTING SAME

CROSS-REFERENCE TO RELATED APPLICATIONS

The present application is related to co-pending application Ser. No. 16/737,414 entitled "Monitor Photodiode (MPD) Submount for Vertical Mounting and Alignment of Monitoring Photodiodes" filed concurrently herewith on Jan. 8, 2020, the disclosure of which is incorporated herein by reference in its entirety.

TECHNICAL FIELD

The present disclosure relates to optical communication devices, and more particularly, to a substrate with a stepped profile for simplifying mounting and alignment of transmitter optical subassemblies (TOSA) modules, e.g., via edge mounting, and to reduce the vertical offset between TOSA modules and radio frequency (RF) terminals of the substrate to allow for relatively short electrical interconnect lengths, e.g., via wire bonds.

BACKGROUND

Optical transceivers are used to transmit and receive optical signals for various application including, without limitation, internet data center, cable TV broadband, and fiber to the home (FTTH) applications. Optical transceivers provide higher speeds and bandwidth over longer distances, for example, as compared to transmission over copper cables. The desire to provide higher speeds in smaller optical transceiver modules has presented challenges, for example, with respect to space management and manufacturing yield.

Optical transceiver modules generally include one or more transmitter optical subassemblies (TOSAs) for transmitting optical signals and one or more receiver optical subassemblies (ROSAs) for receiving optical signals. In general, TOSAs include one or more lasers to emit one or more channel wavelengths and associated circuitry for driving the lasers and monitoring power to ensure nominal performance. However, continued scaling and the standardization of transmission speeds of up to and exceeding 400 Gbp/s presents numerous technical challenges that complicates mounting and electrical interconnection between TOSA modules and a supporting substrate, e.g., a printed circuit board (PCB).

BRIEF DESCRIPTION OF THE DRAWINGS

These and other features and advantages will be better understood by reading the following detailed description, taken together with the drawings wherein:

FIG. 6A shows a front view of a monitor photodiode submount suitable for use in the multi-channel optical transceiver module of FIG. 2, in accordance with an embodiment.

FIG. 6B shows a perspective view of the monitor photodiode submount of FIG. 6A in accordance with an embodiment.

FIG. 6C shows another perspective view of a rear side of the monitor photodiode submount of FIG. 6A in accordance with an embodiment.

DETAILED DESCRIPTION

As discussed above, scaling and increased transmission speeds raise numerous challenges in optical subassembly design. One such challenge includes reducing the impact of electrical interconnection devices, e.g., wire bonds, on high frequency signals such as radio frequency (RF) signals that drive TOSA modules.

Figure 8:
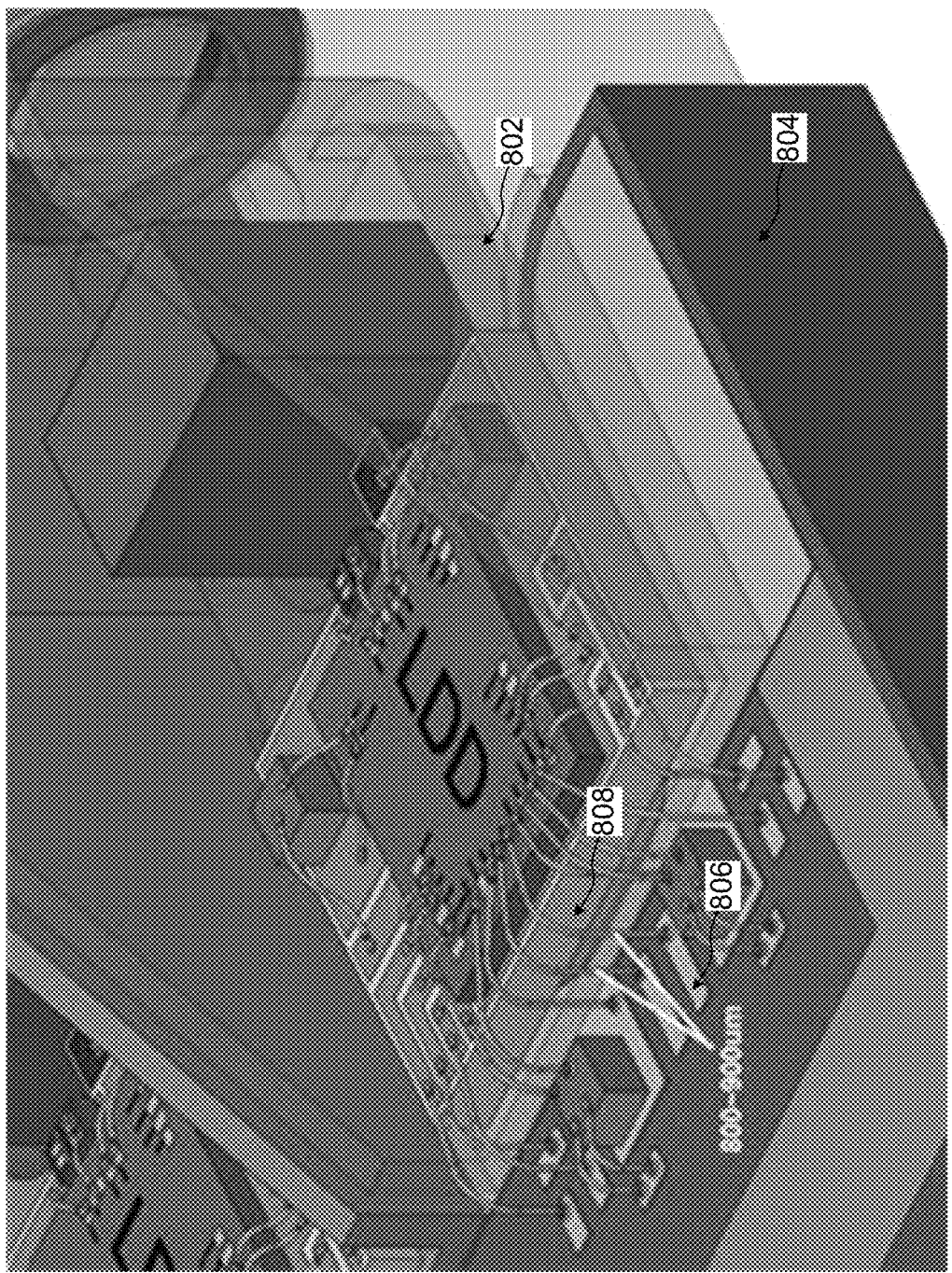
FIG. 8 shows an example approach to mounting and electrical coupling of transmitter optical subassemblies (TOSA) modules on a transceiver substrate.

These challenges are better understood by way of illustration. FIG. 8 shows a portion of a transceiver substrate 804, e.g., a printed circuit board, that edge-mounts to a plurality of TOSA modules, e.g., TOSA module 802. In this example, the TOSA modules 802 can be at least partially formed/configured separate from the transceiver substrate 804 and then subsequently coupled "on board" the transceiver substrate 804. Such "on board" mounting of optical subassemblies can significantly simply manufacturing and design of transceivers and other devices that transmit and/or receive optical signals.

As further shown in FIG. 8, this on-board mounting can include the laser diode driver (LDD) of each TOSA module electrically coupling with adjacent RF terminals, e.g., RF terminals 806, to receive RF driving signals to modulate an associated laser by way of wire bonds 808. However, electrical interconnects such as wire bonds 808 can introduce time of flight (ToF) issues for RF signals, as well as impedance matching issues which can significantly degrade signaling performance. Wire bonds also tend to be fragile and can easily break by inadvertent contact.

In the context of wire bonding specifically, one approach to mitigate the impact of such issues on signaling performance includes having wire bonds with relatively short overall lengths. While this solution seems relatively simple, space constraints and other factors such as component layout can complicate or otherwise prevent shortening wire bond lengths. For instance, in the context of FIG. 8, the TOSA 802 includes a submount that vertically displaces the LDD, and importantly, the electrodes of the LDD that receive RF signaling. This vertical displacement results in wire bonds 808 extending at substantially 90 degrees from the RF terminals and having an overall length of about 800-900 microns to reach corresponding LDD terminals. Such overall wire bond lengths significantly impact signal quality, particularly high frequency RF signals, and ultimately can limit the maximum achievable transmission speeds of the TOSA module.

Continued development to achieve ever-higher optical transmission speeds, e.g., up to and beyond 400 Gbp/s, depends at least in part on optical subassembly module designs that significantly reduce the length of electrical interconnections between associated components without increasing design and manufacturing complexity. Moreover, continued development and rapid adoption of such high-speed transmission systems further depends at least in part on optical subassembly module designs that both shorten electrical interconnect lengths and allow for continued scaling without substantial redesign of existing components, such as PCBs and TOSA modules.

Thus, in accordance with an embodiment, a stepped profile for substrates that support "on board" optical subassembly arrangements is disclosed that allows for mounting of TOSA modules to the substrate in a recessed orientation to reduce the overall distance between terminals of the substrate and associated components of the TOSA, e.g., RF terminals of the substrate and an LDD of the TOSA. In an embodiment, the substrate comprises a printed circuit board PCB or PCB assembly (PCBA) that includes an electrical coupling end to electrically couple with external circuitry and an optical coupling end to couple to one or more TOSA modules. The substrate provides at least a first component mounting surface for coupling to circuitry to provide power and driving signals to the one or more TOSA modules. The substrate further defines a recessed TOSA mounting surface at the optical coupling end. The TOSA mounting surface extends substantially parallel with the first component mounting surface, and is offset from the same by a first predetermined offset distance. Thus, TOSA modules mount to the substrate via the recessed TOSA mounting surface, and components such as LDDs that would otherwise have a vertical offset relative to the supporting traces of the substrate (e.g., as shown in FIG. 8) get displaced towards the same based on the first predetermined offset distance. The TOSA module components may therefore get "countersunk" via the recessed TOSA mounting surface to allow for relatively shorter electrical interconnection with the substrate.

Substrates having stepped profiles consistent with the present disclosure advantageously utilize the recessed TOSA mounting surface to allow for mounting of TOSA modules in a manner that maintains the advantages and simplicity of "on board" TOSA arrangements while also significantly reducing the overall length of electrical interconnections to provide RF and/or power signals to the same. In an embodiment, the stepped profile reduces electrical interconnection lengths by up to and exceeding 50% relative to approaches that do not feature substrates with stepped profiles (e.g., compare FIG. 8 with FIG. 7B), and as a result, the stepped profile significantly reduces the introduction of signal degradation when utilizing relatively longer electrical interconnections.

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. This disclosure is equally applicable to coarse wavelength division multiplexing (CWDM). In one specific example embodiment, the channel wavelengths are implemented in accordance with local area network (LAN) wavelength division multiplexing (WDM), which may also be referred to as LWDM. The term "coupled" as used herein refers to any connection, coupling, link or the like and "optically coupled" refers to coupling such that light from one element is imparted to another element. Such "coupled" devices are not necessarily directly connected to one another and may be separated by intermediate components or devices that may manipulate or modify such signals.

The term substantially, as generally referred to herein, refers to a degree of precision within acceptable tolerance that accounts for and reflects minor real-world variation due to material composition, material defects, and/or limitations/peculiarities in manufacturing processes. Such variation may therefore be said to achieve largely, but not necessarily wholly, the stated characteristic. To provide one non-limiting numerical example to quantify "substantially," minor variation may cause a deviation of up to and including ±5% from a particular stated quality/characteristic unless otherwise provided by the present disclosure.

Figure 1:
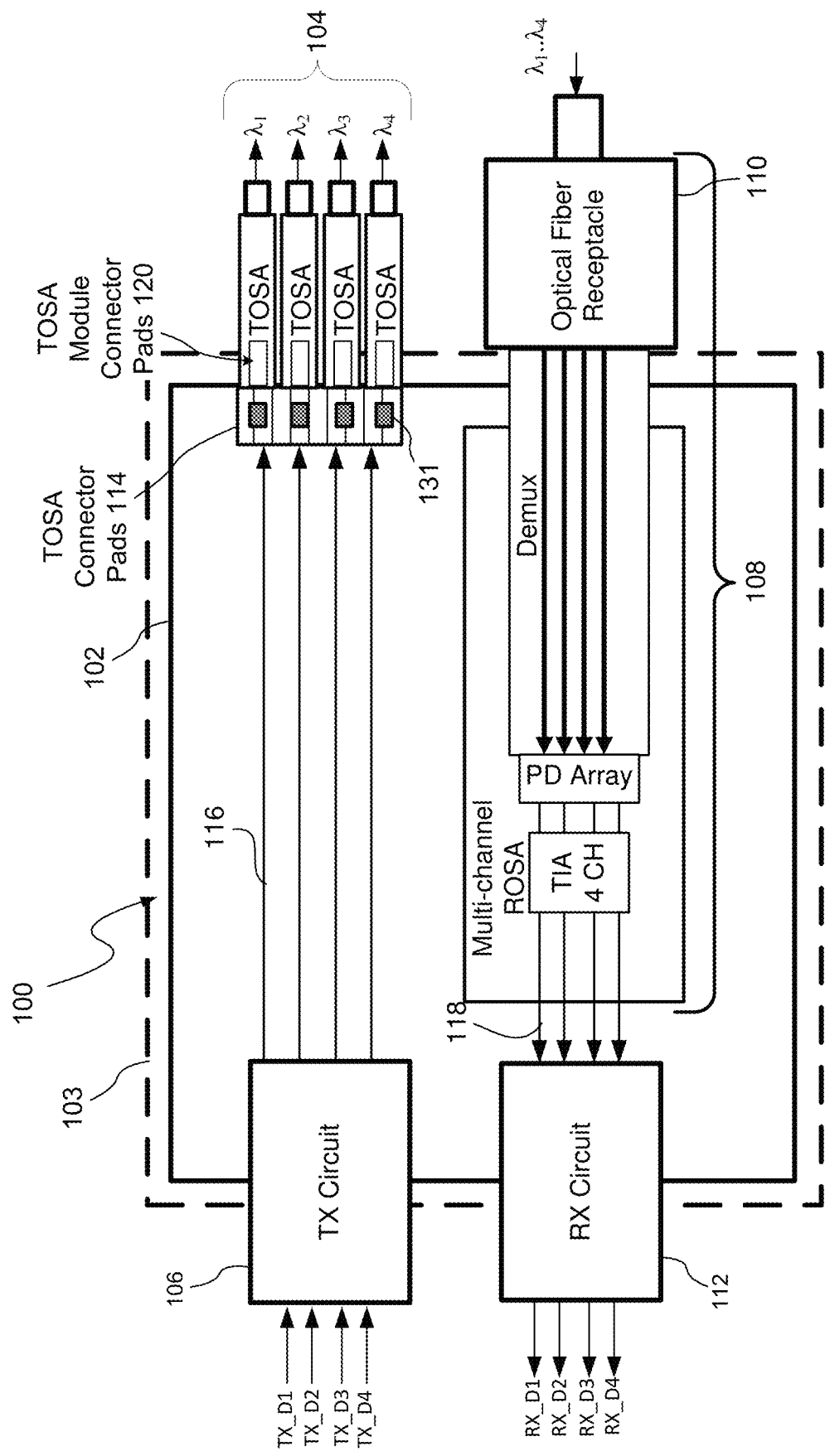
FIG. 1 shows a block diagram of an example multi-channel optical transceiver module in accordance with an embodiment of the present disclosure.

Referring to the Figures, FIG. 1 illustrates an optical transceiver module 100, consistent with embodiments of the present disclosure. The optical transceiver module 100 is shown in a highly simplified form for clarity and ease of explanation and not for purposes of limitation. In this embodiment, the optical transceiver module 100 can be pluggable (e.g., comports with pluggable small form factor (SFFP) standards) and transmits and receives four (4) channels using four different channel wavelengths ($\lambda 1$, $\lambda 2$, $\lambda 3$, $\lambda 4$) and may be capable of transmission rates of at least about 25 Gbps per channel. In one example, the channel wavelengths $\lambda 1$, $\lambda 2$, $\lambda 3$, $\lambda 4$ may be within a ±13 nm range and have respective channel wavelengths of 1270 nm, 1290 nm, 1310 nm, and 1330 nm, respectively. Other channel wavelengths and configurations are within the scope of this disclosure including those associated with local area network (LAN) wavelength division multiplexing (WDM). For instance, the optical transceiver module 100 can include up to eight (8) or more channels and provide transmission rates of at least 25 Gbps per channel.

The optical transceiver module 100 may also be capable of transmission distances of 2 km to at least about 10 km. The optical transceiver module 100 may be used, for example, in internet data center applications or fiber to the home (FTTH) applications.

In an embodiment, the optical transceiver module 100 is disposed in a transceiver housing 103. The transceiver housing 103 can be configured with one or more cavities to receive one or more optical transceiver modules, depending on a desired configuration.

The optical transceiver module 100 may include a number of components to support transceiver operations. The optical transceiver module 100 may include an optical transceiver substrate 102, a plurality of transmitter optical subassemblies (TOSA) modules 104 for transmitting optical signals having different channel wavelengths, transmit connecting circuit 106, a multi-channel receiver optical subassembly (ROSA) arrangement 108 for receiving optical signals on different channel wavelengths, an optical fiber receptacle 110 to receive and align a fiber connector (e.g., a ferrule) with the ROSA, and a receiver connecting circuit 112.

The optical transceiver substrate 102 includes traces, connector pads, and other circuitry to support transceiver operations. The optical transceiver substrate 102 may include TOSA connector pads 114 (or terminals 114) that enable each of the TOSA modules 104 to mount and electrically couple to the optical transceiver substrate 102. The TOSA connector pads 114 may also be referred to herein as a simply connector pads. The optical transceiver substrate 102 may include traces 116 that couple the TOSA connector pads 114 to the transmit connecting circuit 106. As discussed in greater detail below, monitor photodiode (PD) submounts/modules may be disposed on (e.g., directly) the traces 116 and/or the TOSA connector pads 114.

The optical transceiver substrate 102 may include traces 118 that electrically couple the ROSA arrangement 108 to the receiver connecting circuit 112. The optical transceiver substrate 102 may provide an optical transceiver module that may be "plugged" into an optical transceiver cage. Therefore, the transmit connecting circuit 106 and the receiver connecting circuit 112 may electrically couple to external circuitry of the optical transceiver cage. The optical transceiver substrate 102 may be manufactured from a multi-layer printed circuitry board (PCB), although other types of substrates may be utilized and are within the scope of this disclosure.

Each of the TOSA modules 104 may be configured to receive driving electrical signals (TX_D1 to TX_D4), convert the electrical signals to a multiplexed optical signal (e.g., a signal with channel wavelengths λ1 . . . λn) and output the same to a multiplexer (not shown). Each of the TOSA modules 104 may be electrically coupled to the TOSA connector pads 114 and to the traces 116 through TOSA module connector pads 120. Each of the TOSA modules 104 may include a laser diode device and supporting circuitry. The laser diode devices of the TOSA modules 104 may include distributed feedback lasers (DFBs), Vertical External-cavity Surface-emitting lasers (VECSEL) or other suitable laser devices. In an embodiment, monitor photodiodes 131 may be used to monitor the lasers' output power, as discussed below.

Figure 2:
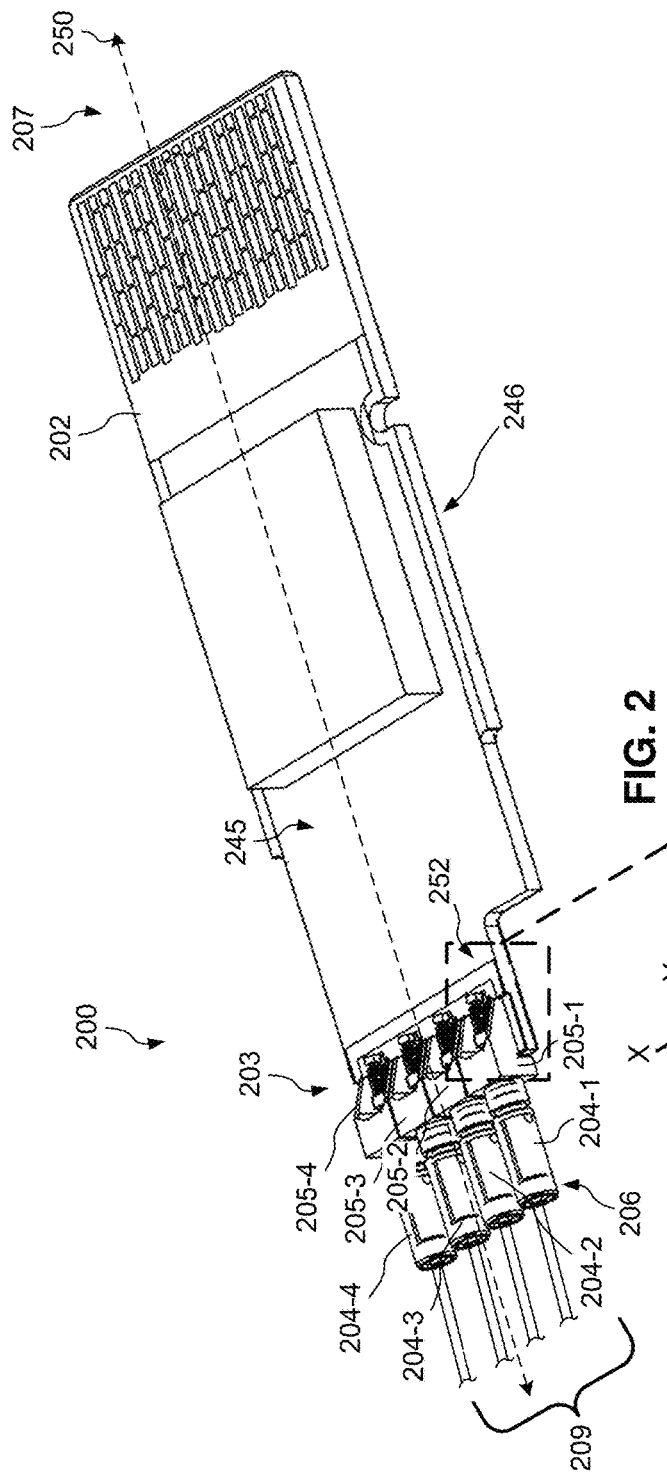
FIG. 2 is a perspective view of a multi-channel optical transceiver module for use in the multi-channel optical transceiver of FIG. 1, in accordance with an embodiment of the present disclosure.

Referring to FIG. 2, an example embodiment of a multi-channel optical transceiver module for use in the multi-channel optical transceiver of FIG. 1 is shown. As shown, the multi-channel optical transceiver module 200 includes an optical transceiver substrate 202 coupled to a TOSA arrangement 206. The optical transceiver substrate 202 may also be referred to herein as a substrate. The optical transceiver substrate 202 may be manufactured from a multi-layer printed circuitry board, although other types of substrates may be utilized and are within the scope of this disclosure.

The optical transceiver substrate 202 includes a first end 203 that extends to a second end 207 along a longitudinal axis 250. The first end 203 couples to one or more TOSA modules, such as shown, for launching channel wavelengths onto transmit waveguides, e.g., optical fibers 209. The second end 207 includes terminals/pads for electrical coupling with external circuitry to receive power and data signals. Accordingly, the first end 203 may also be referred to herein as an optical coupling end, and the second end 207 may be referred to as an electrical coupling end.

The transceiver substrate 202 further includes at least a first mounting surface 245 disposed opposite a second mounting surface 246 for supporting passive and/or active optical components. The first and second mounting surfaces 245, 246 may also be referred to as first and second component mounting surfaces. Although not shown in the embodiment of FIG. 2, the optical transceiver substrate 202 can include a multi-channel ROSA arrangement mounted to and supported by the first and/or second mounting surfaces 245, 246.

Continuing on, the TOSA arrangement 206 includes a plurality of TOSA modules 205-1 to 205-4. Each TOSA module of the plurality of TOSA modules 205-1 to 205-4 includes a base/body portion, and in the particular embodiment illustrated in FIG. 2, cuboid-type base portions. The plurality of TOSA modules 205-1 to 205-4 each support and align an associated laser arrangement with optical coupling ports 204-1 to 204-4, respectively. Thus, channel wavelengths generated by the laser arrangements get launched on to associated optical fibers 209 by way of optical coupling receptacles 204-1 to 204-5. Each laser arrangement may be configured to emit a different channel wavelength and can be monitored by an associated MPD module of an array of MPD modules to ensure nominal optical power, as will be discussed in greater detail below.

Continuing on, each of the plurality of TOSA modules 205-1 to 205-4 mount, e.g., edge mount, to the first end 203 of the substrate. The transceiver substrate 202 further includes a stepped profile, with the stepped profile being at least partially defined by a step/shoulder 211 proximate the first end 203. Additional aspects of the stepped profile are discussed below with reference to FIGS. 7A-7B. Each of the TOSA modules 205-1 to 205-4 can include a base with a plurality of sidewalls that define a generally L-shaped profile that corresponds with the step 211. The profile of the base may therefore advantageously align along at least two axis, e.g., the X and Z axis, by simply engaging/bottoming out against surfaces of the step 211, e.g., vertical surface 704 shown and discussed below with reference to FIG. 7A, that operate as an alignment guide by providing mechanical stops/limits to limit travel along at least one axis. Alignment along the remaining axis, e.g., the Y axis, may therefore be performed by relatively simply lateral movement (e.g., along the X axis) of each TOSA module 205-1 to 205-4.

Figure 3:
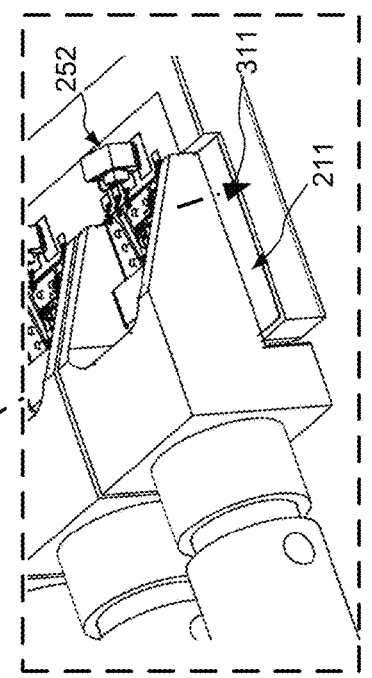
FIG. 3 shows an enlarged region of the multi-channel optical transceiver module of FIG. 2 in accordance with an embodiment of the present disclosure.
Figure 4:
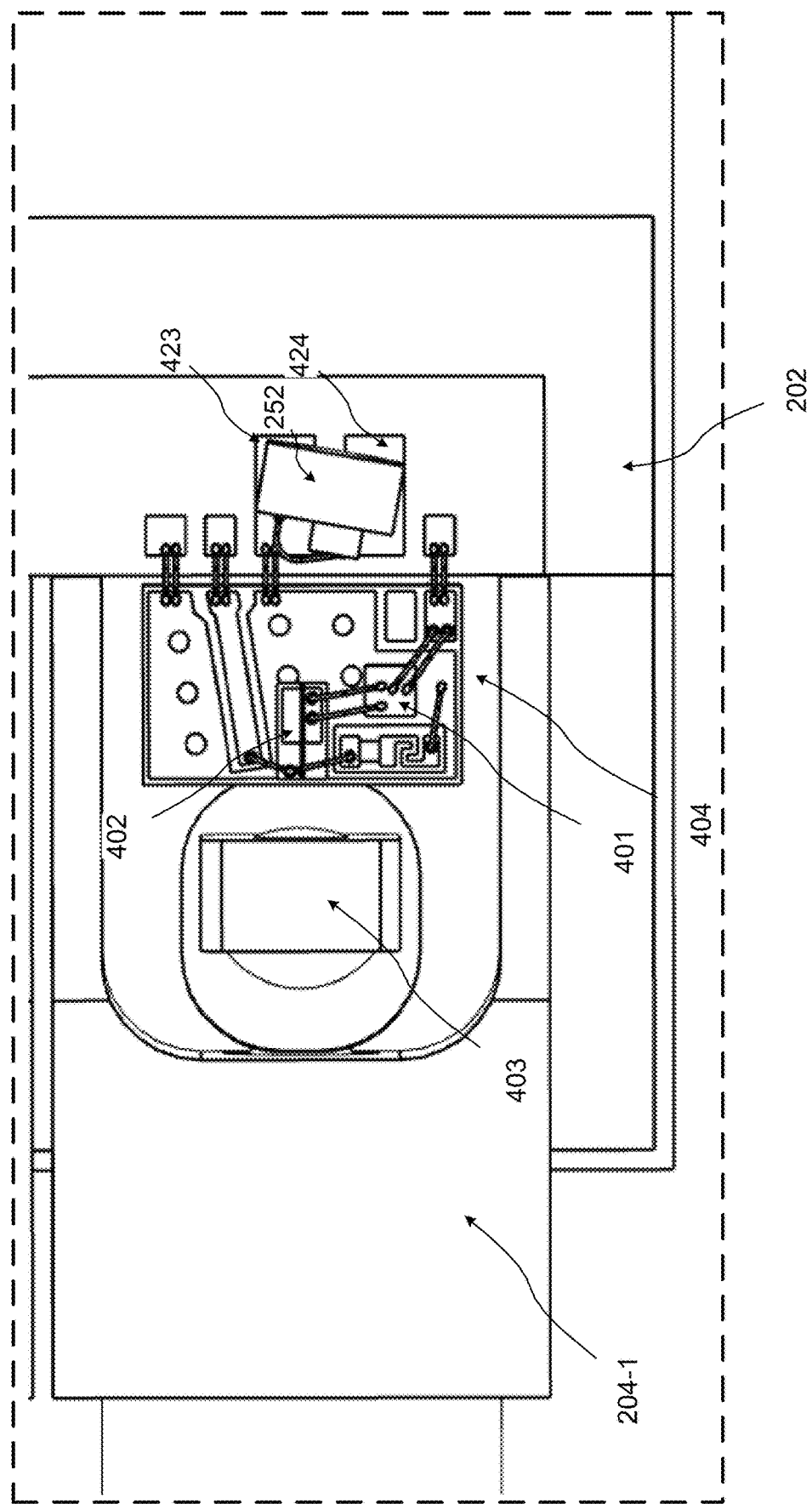
FIG. 4 shows a top view of the enlarged portion shown in FIG. 3, in accordance with an embodiment of the present disclosure.

Once aligned, each of the plurality of TOSA modules electrically couple to the transceiver substrate 202, and more particularly TOSA module connector pads disposed proximate the first end 203 of the transceiver substrate 202, which is shown more clearly in FIGS. 3 and 4. The TOSA module connector pads allow each of the TOSA modules 204-1 to 204-5 to receive driving signals and power from transmit connecting circuitry, e.g., via traces 116 and TX connecting circuit 106 (See FIG. 1).

Referring to FIGS. 3-4, an enlarged region of the multi-channel optical transceiver module of FIG. 2 is shown in accordance with embodiments of the present disclosure. As shown, each TOSA module of the TOSA arrangement 206 includes a laser arrangement having, for example, a filtering capacitor 401, laser diode (LD) 402, and focusing lens 403. One such laser arrangement 712 is shown in further detail in FIG. 7A. The components of the TOSA arrangement 206, such as LD 402, can directly mount to the body of the associated TOSA module, or indirectly via an LD submount 404, such as shown. The LD submount 404 can support components of each laser arrangement and provide electrical traces and other circuitry to support TOSA operations. Note the LD submount 404 may also couple directly to the body of the TOSA module, or indirectly by way of one or more baseplates, such as base plate 709 shown more clearly in FIG. 7A.

The LD 402 can be implemented as a distributed feedback lasers (DFBs), Vertical External-cavity Surface-emitting lasers (VECSEL) or other suitable laser devices. Preferably, the LD 402 is implemented as an electro-absorption modulator laser (EML). In an embodiment, the LD 402 can be uncooled (e.g., operate without an associated thermoelectric cooler). Instead, the LD 402 is in thermal communication with the body of the TOSA module to dissipate heat. In addition, the body of the TOSA module may also be in thermal communication with the transceiver substrate 202 via the step 211 to further increase heat dissipation. Accordingly, in an embodiment each TOSA module can provide a thermal communication path 311 that extends between each LD and the transceiver substrate 202 by way of an associated LD submount, TOSA body, and the step 211 of the transceiver substrate 202.

Figure 5:
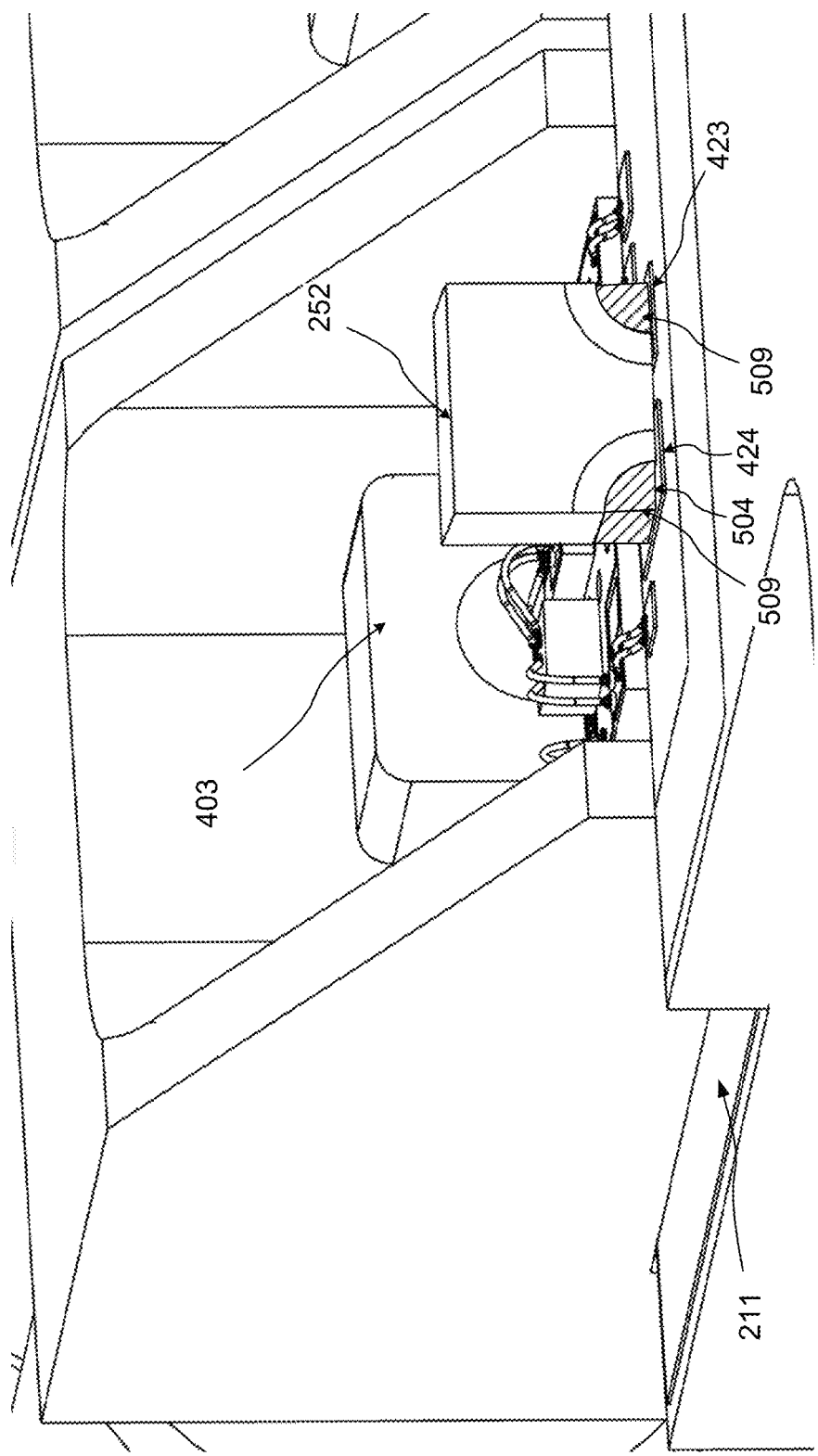
FIG. 5 shows another enlarged region of the multi-channel optical transceiver module of FIG. 2 in accordance with an embodiment of the present disclosure.

Continuing with reference to FIGS. 3-5, the components of each laser arrangement may be disposed coaxially, or substantially coaxially and be aligned with a longitudinal center line of a corresponding optical coupling receptacle (See FIG. 2). Each TOSA module of the TOSA arrangement 206 may therefore also be referred to as cuboid-type coaxial TOSA assemblies, or simply coaxial TOSA assemblies. Notably, cuboid-type TOSA bases allow for each laser assembly to be mounted in close proximity with adjacent cuboid-type TOSAs, e.g., directly contacting each other in a side-by-side relationship. Alternatively, spacing between the cuboid-type TOSA bases can provide for thermal isolation between adjacent TOSA modules (e.g., based on an air gap) while ensuring a relatively small overall footprint for the TOSA arrangement 206.

In operation, each TOSA module 205-1 to 205-4 of the TOSA arrangement 206 can emit associated channel wavelengths and launch the same along optical fibers 209, for example. Associated MPDs monitor and ensure nominal power for each of the TOSA modules 205-1, 205-4. As discussed above, each of the TOSA modules includes at least a LD, e.g., LD 402, and at least one corresponding monitor photodiode (MPD), e.g., provided by MPD module 252, to monitor the optical output power. As shown in FIG. 3, for example, the MPD module 252 optically aligns with a back surface of the LD 402 to receive and measure a small percentage of light emitted therefrom, e.g., 1-3%. Laser threshold current and slope efficiency are both functions of temperature and aging time. To maintain nominal optical output power, the electrical bias current and modulation current applied to the laser may be varied to compensate the change brought about by the variations in temperature and/or aging time. The optical transceiver module 200 can vary the current applied to the LD 402 based on the measured light to, for instance, maintain a stable output power based on an average output current of the MPD module 252.

Referring to FIGS. 6A-6C, an example monitor photodiode submount 610 suitable for use with the MPD module 252 is shown in accordance with an embodiment. The monitor photodiode (MPD) submount 610 is configured to couple to and align a MPD 251 with an associated laser diode, as discussed above. The MPD submount 610 comprises a base 617 having a plurality of sidewalls to provide at least one mounting surface for supporting an MPD and supporting circuitry and at least one mating surface for coupling to an associated transceiver substrate. The base 617 can comprise, for instance, Silicon (Si), or any other non-conductive suitably rigid material. The base 617 may be formed monolithically from a single piece of material or from multiple pieces. While the following discussion includes reference to disposing/patterning metallic material on to a non-conductive base, e.g., formed from Si to provide electrically conductive paths, the base 617 may be at least partially formed from a conductive material such as a metal to provide integrated traces. In this instance, multiple independent electrical traces/paths may be provided by disposing an electrical insulating layer therebetween.

Continuing on, at least one sidewall defining the base 617 of the submount 610 provides a mounting surface 609 for coupling to and supporting MPD 251, such as shown. At least one sidewall defining the base 617 of the submount 610 further provides mating surface 614 for mounting to and being supported by TOSA connecting pads, as will be discussed in greater detail below. As shown, the mounting surface 609 extends substantially transverse relative to the mating surface 614 to provide a vertical mounting orientation for the MPD 251.

The base 617 further provides at least first and second electrically conductive paths 611, 613 disposed along multiple sidewalls of the base 617 using a plurality of conductive traces disposed/patterned thereon. In particular, the first electrically conductive path 611 is collectively provided by at least first and second conductive traces 612-1, 612-2 (or conductive segments) disposed on the base 617. Likewise, the second electrically conductive path 613 is collectively provided by at least third and fourth conductive traces 612-3 and 612-4 (or conductive segments) disposed on the base 617. Patterning of the conductive traces 612-1 to 612-4 can comprise deposition of one or more layers of metallic material such as copper, silver, or other suitable material on to sidewalls of the base 617.

At least a portion of the first conductive trace 612-1 defines the mounting surface 609 for both physically and electrically coupling to the MPD 251. Further, the first conductive trace 612-1 includes a region with a relatively rectangular profile having a width that is about 1.2× to 1.3× the width of the MPD 251. This rectangular profile may be dimensioned such that corner(s) of the same get disposed at substantially a center of the mounting surface 609. Alignment of the MPD 251 relative to the base 617, and more importantly relative to an associated laser diode, may therefore be initially accomplished along the X, Y and Z axis by ensuring that the edges 619-1 and 619-2 of MPD 251 mount substantially flush with a far edge of rectangular pad provided by the first conductive trace 612-1. Stated differently, alignment of MPD 251 can include mounting the same at a predetermined position on the first conductive trace 612-1 such that edges 619-1 and 612-2 extend parallel with the edges defining the rectangular pad and include a relatively uniform gap therebetween measuring about 0 to 100 microns. The first conductive trace 612-1 may therefore provide a visual alignment indicator, e.g., in the form of a rectangular pad or other regular or non-regular geometric shape, to provide a visual representation of a predefined mounting location for the MPD to simplify mounting and alignment of the same.

The above-discussed mounting and alignment of MPD 251 on to the MPD submount 610 can occur prior to attachment to the transceiver substrate 202 (FIG. 2). The MPD submount 610 may therefore get mounted to the transceiver substrate 202 with the MPD 251 being aligned along at least the X and Z axis with the associated laser diode. Alignment along the Y axis can include simply shifting the MPD submount 610 laterally until nominal optical coupling with an associated laser diode gets achieved.

Continuing on, the first conductive trace 612-1 extends towards the transceiver substrate 202 when the MPD submount is coupled thereto. The first conductive trace 612-1 also extends substantially transverse relative to the first mounting surface 245 of substrate 202 when coupled thereto (See FIG. 3). The first conductive trace 612-1 then transitions to the second conductive trace 612-2 based on an edge/intersection between associated sidewalls of the base 617. The second conductive trace 612-2 extends substantially transverse relative to the mounting surface 609, and substantially parallel relative to the first mounting surface 245 of the transceiver substrate 202 when coupled thereto (See e.g., FIGS. 3-5).

As further shown, third and fourth conductive traces 612-3 and 612-4 are disposed on the base 617 to collectively define a second electrically conductive path to electrically couple the MPD 251 to the transceiver substrate 202. The third conductive trace 612-3 is disposed on the mounting surface 609 and is configured to electrically couple to the MPD 251 via, for instance, wire bonding such as shown. The third conductive trace 612-3 extends towards the transceiver substrate 202 when the MPD submount 610 is coupled thereto. The third conductive trace 612-3 transitions to the fourth conductive trace 612-4 at an edge/intersection between sidewalls of the base 617. The fourth conductive trace 612-4 extends substantially transverse relative to the mounting surface 609 and substantially parallel relative to the first mounting surface 245 of the transceiver substrate 202.

The first and second conductive paths 611, 613 therefore include at least one region/segment that extend substantially in parallel, and proximate, to an interface formed between the mating surface 614 and the first mounting surface 245 of the transceiver substrate 202 when the MPD submount 610 is coupled thereto. As discussed in greater detail below, the first and second conductive paths 611, 613 can be electrically coupled to the transceiver substrate 202 utilizing a conductive epoxy or other conductive material that can be disposed around MPD submount 610.

The MPD 251 can comprise a surface MPD having a detecting surface/region 603 having a receiving area 602 that is configured to be optically coupled with an associated laser diode by being aligned along the X, Y and Z axis. In particular, alignment includes the receiving area being disposed at a position that intersects with an optical path extending from a back surface of the associated laser diode towards the MPD. An anode 604 is disposed on the detecting surface 603. A cathode (not shown) of the MPD 251 is provided on a surface opposite the detecting surface 603. The MPD 251 mounts (e.g., directly) on the first conductive trace 612-1, with the associated cathode electrically connected to the first conductive path 611. The anode 604 electrically couples to the second conductive path 613 by wire bonding, for instance.

As shown in FIGS. 6A-6C, the body 617 of the MPD submount 610 can include channels/notches 631-1, 631-2. The channels 631-1, 631-2 extend substantially transverse relative to mounting surface 609 and include a curved/arcuate profile (such as shown). Other shapes and configurations for the channels 631-1, 631-2 are within the scope of this disclosure. As further shown, the second conductive trace 612-2 and the fourth conductive trace 612-4 are at least partially disposed on the channels 631-1, 631-2. The channels 631-1, 631-2 can advantageously facilitate flow and adhesion of a layer of epoxy 509 (FIG. 5) to securely attach the MPD submount 610 to an associated transceiver substrate, e.g., transceiver substrate 202. In addition, the channels 631-1, 631-2 reduce the overall footprint of the mating surface 614 by providing a taper, and by extension, reducing the overall footprint of the MPD submount 610 when coupled to the transceiver substrate 202 (See FIG. 5). The channels 631-1, 631-2, may thus define a tapered region that at least partially defines the mating surface 614.

When the MPD submount 610 mounts to the transceiver substrate 202 via mating surface 614, conductive epoxy 509 can flow into the channels 631-1, 631-2 to securely attached the MPD submount 610 at a predetermined position, as discussed further below. The rounded profile/shape of the channels 631-1, 631-2 can encourage increased adhesion and allow for a relatively larger amount of conductive epoxy to be utilized and substantially confined without the same inadvertently contacting adjacent conductive pads/traces. Note that while the embodiment of FIGS. 6A-6C show two channels 631-1, 631-2, this disclosure is not limited in this regard. An MPD submount consistent with the present disclosure can have a single channel, or a plurality of channels (as shown), or no channels depending on a desired configuration.

As shown in FIG. 6C, the first and second conductive paths 611, 613 can also include fifth and sixth conductive traces 612-5, 612-6, respectively. The fifth and sixth conductive traces 612-5, 612-6 can be disposed on back surface 616, with back surface 616 being disposed opposite the mounting surface 609. In this embodiment, the fifth and sixth conductive traces 612-5, 612-6 can further increase electrical conductivity via the conductive epoxy and can balance bonding stresses applied to the MPD submount 610.

Referring back to FIGS. 3-5, with additional reference to FIGS. 6A-6C, the MPD submount 610 is shown implemented as MPD module 252. These MPD module 252 is configured to be disposed on the TOSA connector pads 423, 424, and when coupled thereto, an interface 504 gets formed between the MPD module 252 and the surfaces defining the transceiver substrate 202 (See FIG. 5). A layer of conductive epoxy 509, e.g., silver epoxy, may be disposed along the interface 504 between MPD module 252 and surfaces defining the transceiver substrate 202, and in particular, the connector pads 423, 424.

Therefore, the first and the second conductive paths 611, 613 (FIG. 6A) electrically couple to a pad/trace of the transceiver substrate based at least in part on the layer of conductive epoxy 509. Minor adjustment to MPD orientation along the Y axis, e.g., relative to an associated laser diode, can be achieved while the layer of conductive epoxy 509 cures, thus allowing for greater tolerances and multiple manufacturing phases to occur at potentially the same time. To avoid or otherwise reduce reflection losses, the receiving area 602 may be disposed at an angle with respect to the light path of the laser diode. The angle may be, for example, 0-15°, and preferably about 8° relative to normal.

Stepped Profile Architecture

Figure 7A:
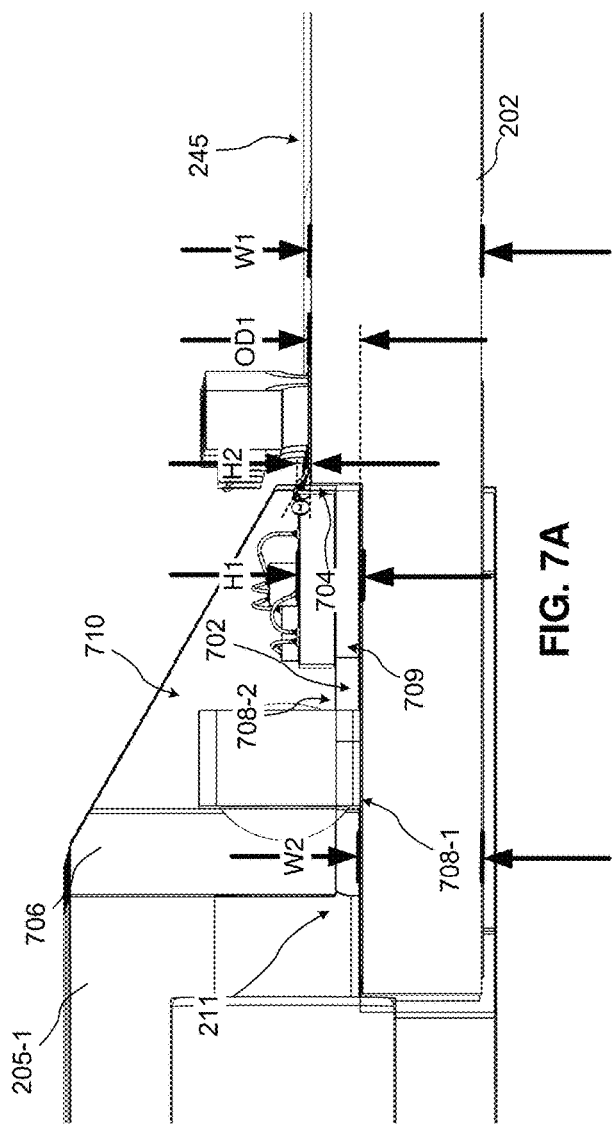
FIG. 7A shows a cross-sectional view of the multi-channel optical transceiver module of FIG. 2 in accordance with an embodiment.

Turning to FIG. 7A an enlarged cross-sectional view of the substrate 202 is shown in accordance with an embodiment. Note, the embodiment of FIG. 7A shows a laser arrangement having a vertically-mounted monitored photodiode, as discussed above. However, the stepped profile is equally applicable to other TOSA configurations including designs where an MPD is mounted to the TOSA body (e.g., See FIG. 7B).

As shown in FIG. 7A, the first component mounting surface 245 defines at least a portion of a first mounting region to allow for mounting of components and to provide traces for electrical interconnection with external circuitry. The first mounting region can therefore extend from the electrical coupling end 207 to a second mounting region disposed at the optical coupling end 203.

The second mounting region is defined at least in part by the step 211. The step 211 defines at least a portion of the stepped profile which can simplify alignment and coupling processes for TOSA modules, as discussed above. The stepped profile, and in particular, step 211 is defined at least in part by a recessed TOSA mounting surface 702, which may be referred to herein as simply a recessed mounting surface. The recessed mounting surface 702 is offset/recessed from the first component mounting surface 245 by a first offset distance (OD1). The offset distance OD1 measures between 10 and 50 microns, and preferably, 10-20 microns The stepped profile may therefore be provided by the recessed TOSA mounting surface 702 extending substantially parallel with the first component mounting surface 245 and substantially transverse relative to vertical surface 704, with the vertical surface 704 adjoining the recessed mounting surface 702 and the first component mounting surface 245. The overall height of vertical surface 704 can be predetermined to establish the first offset distance OD1. As shown in FIGS. 2 and 7A, the first mounting region is shown as the portion of the substrate 202 having a first overall width W1. The first mounting region preferably includes a uniform width, or may vary along the longitudinal axis 250 (See FIG. 2) up to a maximum width equal to W1. On the other hand, the second mounting region is shown as the portion of the substrate 202 having a second overall width W2, with the second overall width W2 being less than the first overall width. The second mounting region also includes, preferably, a uniform width although this disclosure is not limited in this regard and the second overall width W2 can vary along the longitudinal axis up to a maximum width equal to W2.

As further shown in FIG. 7A, the first TOSA module 205-1 includes a body 706 (or base) configured to securely mount, e.g., edge mount, to the second mounting region of the substrate 202. The body 706 includes a plurality of sidewalls that provide a substrate mating surface 708-1 and a component mounting surface 708-2. The substrate mating surface 708-1 is disposed opposite the component mounting surface 708-2, and in the embodiment shown in FIGS. 7A-7B, the component mounting surface is accessible via an opening 710 defined by sidewalls of the body 706 that extend substantially transverse from the component mounting surface 708-2.

Thus, the recessed TOSA mounting surface 702 underlies and supports at least a portion of the substrate mating surface 708-1, and thus by extension, the body 706 of the at least one TOSA module 205-1. In an embodiment, epoxy or other adhesive material may be disposed between the recessed TOSA mounting surface 702 and the substrate mating surface 708-1 to securely attach the body 706 to the substrate 202, although other attachment methods are within the scope of this disclosure such as welding. In this embodiment, the stepped profile operates, in a general sense, as a dam to prevent epoxy from contacting other surfaces such as the substrate mating surface 708-1. Accordingly, the stepped profile also aids in containing and confining epoxy during manufacturing, which can reduce component failure and the time required for post-processing stages to remove excess epoxy.

The recessed TOSA mounting surface 702 can include one or more layers of metallic material disposed thereon (See FIG. 7B), e.g., such as Gold (Au) or Copper (Cu), to increase thermal communication between the TOSA module 205-1 and the substrate 202 and/or to allow for attachment via welding/soldering.

Figure 7B:
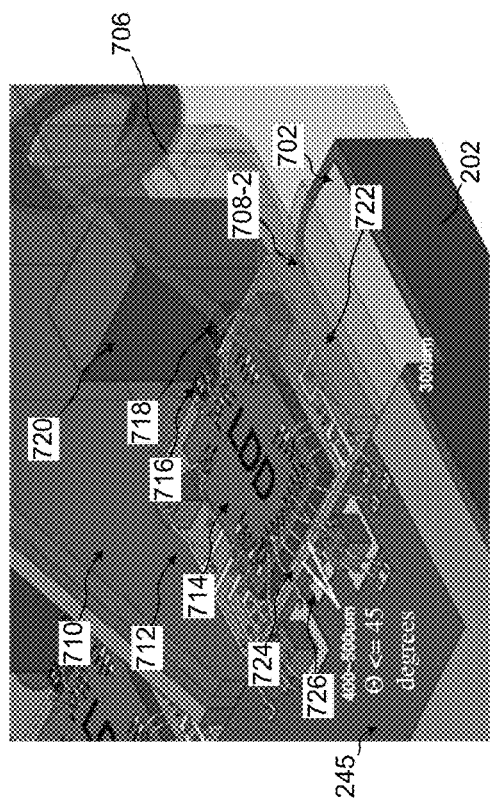
FIG. 7B shows an enlarged portion of a multi-channel optical transceiver module consistent with an embodiment of the present disclosure.

Turning to FIG. 7B, with additional reference to FIG. 7A, the body 706 includes at least one laser arrangement 712 mounted to the component mounting surface 708-2 of the body 706. As shown, the laser arrangement 712 includes a laser diode driver 714, a laser diode 716, a monitor photodiode 718 and a focus lens 720. The laser arrangement 712 may include more or fewer active and/or passive optical components depending on a desired configuration, and the embodiment shown in FIG. 7B is not intended to be limiting.

As further shown, the at least one laser arrangement 712 mounts to the body 706, and more particularly, the component mounting surface 708-2 by way of a submount 722 and optional base plate 709. The submount 722 can provide traces/terminals for electrical connectivity with components of the at least one laser arrangement 712. The overall height H1 of the submount 722 (e.g., including the base plate 709) may therefore measure substantially equal to or greater than the first offset distance OD1. Accordingly, an invisible line drawn at the first component mounting surface 245, and parallel thereto, can intersect with the submount 722 and/or at least one component of the at least one laser arrangement 712 such as the LDD 714 and LD 716.

Stated differently, the submount 722 vertically displaces the components of the at least one laser arrangement 712 relative to the component mounting surface 708-2 of the body 706, e.g., by overall height H1, but the vertical displacement gets 'offset' based on stepped profile of the substrate 202, and more particularly, the first offset distance (OD1) of the recessed TOSA mounting surface 702 relative to the first component mounting surface 245 of the substrate 202. Stated simply, the recessed TOSA mounting surface 702 gets countersunk relative to the first component mounting surface 245. The overall height H2 between the first component mounting surface 245 and a top surface of the submount 722 that supports the optical components of the at least one laser arrangement 712 is less than 400 microns, and preferably, less than 200 microns.

Accordingly, relatively short electrical interconnects, e.g., wire bonds 724, electrically couple the LDD 714 to RF terminals/traces 726 disposed on the first component mounting surface 245. In the shown embodiment, the overall length of each of the wire bonds 724 measures between 400 and 500 microns, and preferably, less than 400 microns. In addition, each of the wire bonds 724 extend at an angle θ relative to the first component surface 245, with angle θ being less than or equal to 45 degrees.

Substrates having stepped profiles consistent with the present disclosure advantageously position components such as LDDs in close proximity with supporting terminals of the substrate 202. By way of contrast, consider the embodiment of FIG. 8 which shows a substrate and TOSA modules with a substantially similar size and dimension to that of the embodiments shown in FIGS. 7A-7B. However, the stepped profile of the substrate 202 shown in FIGS. 7A and 7B allows for wire bonds 724 to be shortened/reduced in length by up to and exceeding 50% relative to wire bonds 808 of FIG. 8. Moreover, the wire bonds 724 extend at a relatively acute angle θ to provide a low-profile implementation. On the other hand, the wire bonds 808 shown in FIG. 8 extend from substrate 804 at roughly a 90 degree angle, which increases the risk of inadvertent contact and damage. In any event, this reduction in wire bond length translates directly to improved signal quality, and in addition, enables maximum transmission speeds otherwise unachievable with longer electrical interconnections.

In accordance with an aspect of the present disclosure an optical subassembly module is disclosed. The optical subassembly module comprising a substrate having an electrical coupling end for electrically coupling to external circuitry and an optical coupling end for launching at least one channel wavelength on a waveguide, the electrical coupling end disposed opposite the optical coupling end, a first mounting region at the electrical coupling end of the substrate to provide traces for electrical interconnection with the external circuitry, the first mounting region defined at least in part by a component mounting surface provided by a sidewall of the substrate, a second mounting region at the optical coupling end of the substrate to couple to and support at least one transmitter optical subassembly (TOSA) module via a recessed TOSA mounting surface, the recessed TOSA mounting surface being disposed offset from the component mounting surface by first offset distance (OD1) based on a stepped profile, the stepped profile defined at least in part by the recessed TOSA mounting surface extending substantially parallel with the component mounting surface and substantially transverse relative to a vertical surface adjoining the recessed TOSA mounting surface and the component mounting surface.

In accordance with another aspect of the present disclosure an optical transceiver is disclosed. The optical transceiver comprising a transceiver substrate having an optical coupling end disposed opposite an electrical coupling end, at least one component mounting surface provided by the transceiver substrate extending between the optical coupling end and the electrical coupling end, and a recessed transmitter optical subassembly (TOSA) mounting surface at the optical coupling end of the substrate for coupling to and supporting at least one TOSA module, and wherein the recessed TOSA mounting surface extends substantially parallel with the at least one component mounting surface and substantially transverse relative to a vertical surface adjoining the recessed TOSA mounting surface and the at least one component mounting surface, at least one TOSA module coupled to optical coupling end of the transceiver substrate, and a receiver optical subassembly arrangement coupled to the transceiver substrate.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:

1. An optical subassembly module, the optical subassembly module comprising:
    a substrate having an electrical coupling end for electrically coupling to external circuitry and an optical coupling end for launching at least one channel wavelength on a waveguide, the electrical coupling end disposed opposite the optical coupling end;
    a first mounting region at the electrical coupling end of the substrate to provide traces for electrical interconnection with the external circuitry, the first mounting region defined at least in part by a component mounting surface provided by a sidewall of the substrate;
    a second mounting region at the optical coupling end of the substrate to couple to and support at least one transmitter optical subassembly (TOSA) module via a recessed TOSA mounting surface, the recessed TOSA mounting surface being disposed offset from the component mounting surface by first offset distance (OD1) based on a stepped profile, the stepped profile defined at least in part by the recessed TOSA mounting surface extending substantially parallel with the component mounting surface and substantially transverse relative to a vertical surface adjoining the recessed TOSA mounting surface and the component mounting surface; and
    wherein the vertical surface provides a mechanical stop to engage a surface of the least one TOSA module and limit travel of the at least one TOSA module along one or more axis, and wherein the second mounting region at the optical coupling end of the substrate is configured to edge mount to the at least one TOSA module.

2. The optical subassembly module of claim 1, wherein the optical subassembly module further comprises the at least one TOSA module edge mounted to the second mounting region of the substrate, the at least one TOSA module having a body that includes a component mounting surface to couple to a laser arrangement and a substrate mating surface disposed opposite the component mounting surface of the body, the substrate mating surface of the body to couple to the recessed TOSA mounting surface of the optical coupling end of the substrate and extend from the substrate along an axis that is substantially parallel with a longitudinal axis of the substrate.

3. The optical subassembly module of claim 2, wherein the substrate mating surface of the body is vertically offset from the component mounting surface of the substrate by the first offset distance.

4. The optical subassembly module of claim 2, wherein the laser arrangement of the at least one TOSA module comprises a laser diode driver (LDD) disposed on the component mounting surface of the TOSA module.

5. The optical subassembly of claim 4, wherein the LDD is electrically coupled to radio frequency (RF) terminals disposed on the component mounting surface of the substrate adjacent the optical coupling end via a plurality of wire bonds.

6. The optical subassembly of claim 5, wherein each of the plurality of wire bonds extend from the component mounting surface of the substrate at an angle less than or equal to 45 degrees.

7. The optical subassembly of claim 5, wherein each of the plurality of wire bonds has an overall length of less than 500 microns.

8. The optical subassembly of claim 1, wherein the second mounting region is configured to couple to and support a plurality of TOSA modules.

9. The optical subassembly of claim 1, wherein the substrate is a printed circuit board, and wherein the optical subassembly is a multi-channel optical transmitter or multi-channel optical transceiver capable of transmitting multiple channel wavelengths.

10. An optical transceiver, the optical transceiver comprising:
    a transceiver substrate having an optical coupling end disposed opposite an electrical coupling end;
    at least one component mounting surface provided by the transceiver substrate extending between the optical coupling end and the electrical coupling end; and
    a recessed transmitter optical subassembly (TOSA) mounting surface at the optical coupling end of the substrate for coupling to and supporting at least one TOSA module, and wherein the recessed TOSA mounting surface extends substantially parallel with the at least one component mounting surface and substantially transverse relative to a vertical surface adjoining the recessed TOSA mounting surface and the at least one component mounting surface;
    at least one TOSA module edge mounted to the optical coupling end of the transceiver substrate, wherein the vertical surface provides a mechanical stop to engage a surface of the least one TOSA module and limit travel of the at least one TOSA module along one or more axis; and a receiver optical subassembly arrangement coupled to the transceiver substrate.

11. The optical transceiver of claim 10, further comprising radio frequency (RF) terminals disposed on the at least one component mounting surface proximate to the optical coupling end, wherein the at least one TOSA module electrically couples with the RF terminals via one or more wire bonds.

12. The optical transceiver of claim 10, wherein the recessed TOSA mounting surface is vertically offset relative to the at least one component mounting surface of the transceiver substrate by a first offset distance.

13. The optical transceiver of claim 10, wherein the at least one TOSA module comprises a plurality of TOSA modules, and wherein each TOSA module of the plurality of TOSA modules include a submount and a laser diode driver (LDD) coupled to the submount.

\* \* \* \* \*